US012597936B2

(12) United States Patent
Zhang

(10) Patent No.: US 12,597,936 B2
(45) Date of Patent: Apr. 7, 2026

(54) SYSTEMS AND METHODS OF REAL-TIME FREQUENCY CALIBRATION FOR SEGMENTED VOLTAGE CONTROLLED OSCILLATOR BASED PHASE-LOCK LOOP

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 18/824,325

(22) Filed: Sep. 4, 2024

(65) Prior Publication Data

US 2025/0309904 A1 Oct. 2, 2025

(30) Foreign Application Priority Data

Mar. 28, 2024 (CN) .......................... 202410367199.5

(51) Int. Cl.
*H03L 7/099* (2006.01)
*H03L 7/10* (2006.01)
*H03L 7/16* (2006.01)

(52) U.S. Cl.
CPC ............... *H03L 7/099* (2013.01); *H03L 7/10* (2013.01); *H03L 7/103* (2013.01); *H03L 7/16* (2013.01); *H03L 2207/06* (2013.01)

(58) Field of Classification Search
CPC ......... H03L 7/099; H03L 7/093; H03L 7/103; H03L 7/10; H03L 7/101; H03L 7/102; H03L 7/105; H03L 7/16; H03L 2207/06
See application file for complete search history.

(56) References Cited

U.S. PATENT DOCUMENTS

| | | | |
|---|---|---|---|
| 6,512,419 B1 * | 1/2003 | Adams ................ | H03F 3/45659 331/8 |
| 2011/0298503 A1 * | 12/2011 | Obkircher ............... | H03L 7/099 327/147 |
| 2012/0262238 A1 * | 10/2012 | Dong ........................ | H03L 7/18 331/2 |
| 2013/0057325 A1 * | 3/2013 | Dong ........................ | H03L 7/08 327/147 |

* cited by examiner

*Primary Examiner* — Ryan Johnson

(74) *Attorney, Agent, or Firm* — Michael North

(57) ABSTRACT

Methods and systems of real-time frequency calibration for a segmented-VCO-based PLL are disclosed. The calibration method includes: receiving a request to lock the PLL to an output frequency; looking up a segment selection signal corresponding to the output frequency and controlling operation of a VCO core according to the segment selection signal to lock the PLL to the output frequency; obtaining a tuning voltage input to the VCO core to determine whether the tuning voltage is normal. If the tuning voltage is abnormal, the segment selection signal is adjusted for segment switching or even VCO core switching. This invention allows frequency segment adjustment in advance by adjusting the segment selection signal when the tuning voltage is abnormal, thus ensuring that the output frequency of the VCO core always remains within a frequency segment having a matched frequency range.

18 Claims, 6 Drawing Sheets

Receiving a request to lock the PLL to an output frequency searching in a loop-up table for a segment selection signal corresponding to the output frequency, and operating a current VCO core based on the segment selection signal to lock the PLL to the output frequency Obtaining a tuning voltage inputting to the current VCO core and determining whether the tuning voltage is in a normal operation range, responsive to the tuning voltage exceeding the normal operation range, adjusting the segment selection signal for segment switching from a current frequency segment in the current VCO core to another frequency segment in the current VCO core, or from the current frequency segment in the current VCO core to another frequency segment in another VCO core, until the tuning voltage is within the normal operation range with the PLL being locked to the output frequency

FIG. 1

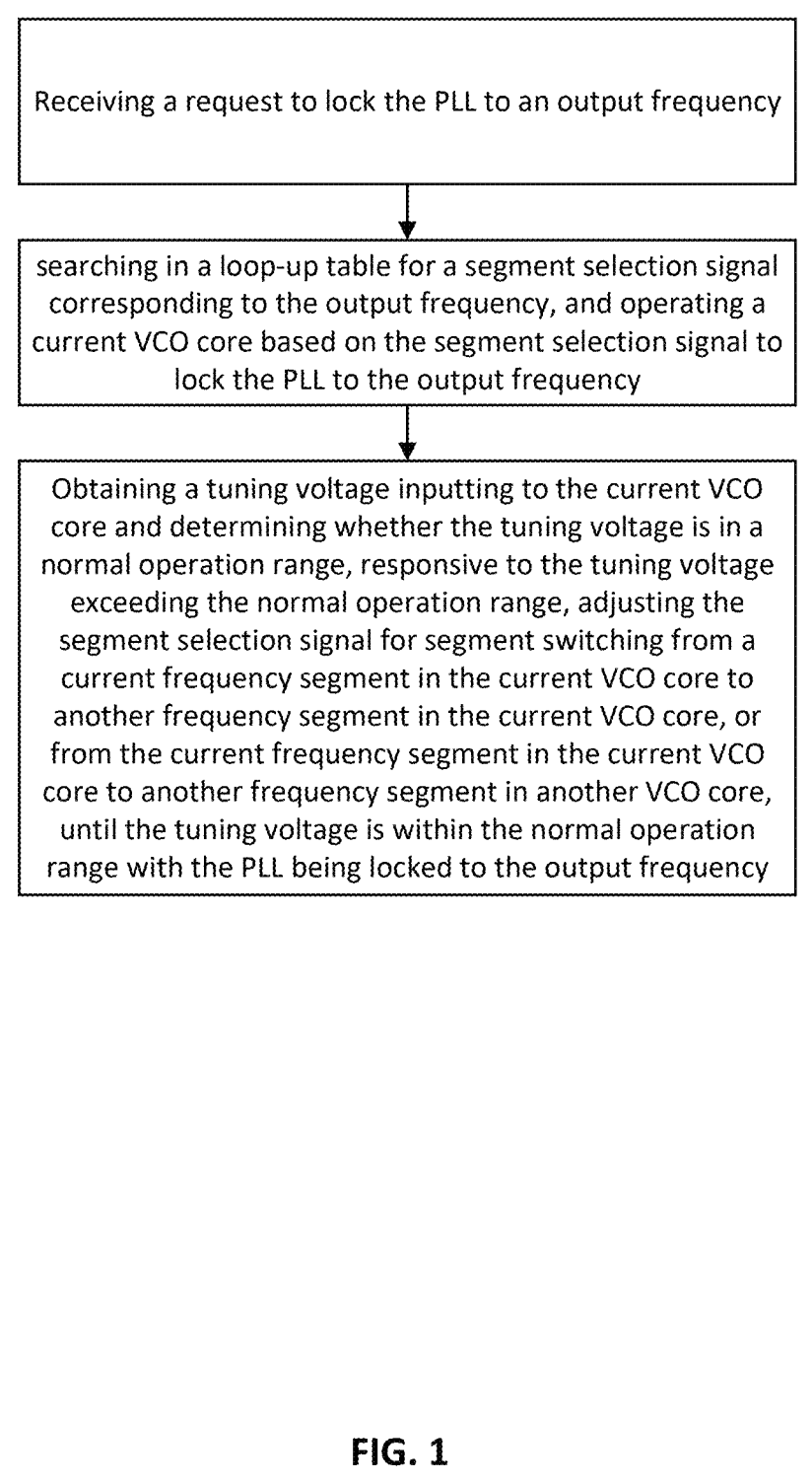

SYSTEMS AND METHODS OF REAL-TIME FREQUENCY CALIBRATION FOR SEGMENTED VOLTAGE CONTROLLED OSCILLATOR BASED PHASE-LOCK LOOP

CROSS-REFERENCE TO RELATED APPLICATIONS

This application claims foreign priority to Chinese Patent Application No. 2024103671995, entitled "SYSTEMS AND METHODS OF REAL-TIME FREQUENCY CALIBRATION FOR SEGMENTED VOLTAGE CONTROLLED OSCILLATOR BASED PHASE-LOCK LOOP", naming Cemin Zhang as inventor, and filed Mar. 28, 2024, the subject matter of which is hereby incorporated herein by reference.

BACKGROUND

A. Technical Field

The present invention relates generally to Phase-Lock Loop (PLL) technology, and more particularly to systems and methods of real-time frequency calibration for a segmented voltage controlled oscillator (VCO) based phase-lock loop (PLL).

B. Background of the Invention

A VCO is an electronic oscillator with oscillation frequency controlled by an input voltage. The applied input voltage determines the instantaneous oscillation frequency. A VCO may be used for various applications, e.g. frequency modulation (FM), phase modulation (PM), a PLL, etc. To achieve a wideband output, a VCO may adopt a segmented structure to incorporate multiple segments having various frequency tuning bands or sub ranges. Those multiple frequency bands typically have frequency overlaps such that the overall frequency tuning range has no frequency void zones. However, at those overlapped frequency bands, the different segments may have some variations in performance. The VCO may need to be initialized or calibrated, especially when the VCO is used in a PLL circuit, such that the PLL has consistent performance across the entire frequency band without lock interruption.

The inventor of the present invention has disclosed in Patent document CN11295352B a calibration method to calibrate a wideband segmented VCO. In embodiments of this method, each segment of a segmented VCO is calibrated to store a precise frequency spanning range for each segment, and a segment selection signal is generated to select a corresponding segment based on a frequency range corresponding to an output frequency request. To solve the problem of output frequency drifting out of the corresponding frequency segment due to temperature variations, and to help avoid PLL lock interruption at various VCO operation temperatures, the calibration method disclosed in Patent document CN11295352B adopts segments with wider frequency spanning ranges and allows a greater frequency overlap rate between segments (e.g., overlap bandwidth rate >5%). After adjusting the highest and lowest frequencies of each segment due to temperature variations, the segment determined by the segment selection signal can effectively cover frequency drift within certain range of temperature changes.

However, segments with a wider frequency spanning range and a greater frequency overlap between segments may lead to higher VCO tuning sensitivity, resulting in greater in-band phase noise for a signal source after frequency lock in the PLL. Moreover, temperature variations or some other factors may cause the frequency of the VCO to continuously increase or decrease, eventually drifting out of the spanning range of its segment and resulting in frequency unlock in PLL.

SUMMARY OF THE INVENTION

One of the purposes of the present invention is to provide methods of real-time frequency calibration for a segmented-VCO-based PLL. After the segmented VCO locks onto a frequency, a tuning voltage input to the VCO core is continuously monitored to ensure that the tuning voltage is within a normal operation range. If the tuning voltage exceeds the normal range, a segment selection signal is adjusted accordingly to switch from a currently selected frequency segment to another segment having a higher or lower frequency spanning range, until the tuning voltage falls back into the normal operation range. This process enables segment switching within the same VCO core or cross-core switching between different VCO cores in response to temperature variations or other impact factors. Such segment switching prevents phase noise deterioration in the PLL or even phase unlock due to frequency drifting out of a frequency segment.

The technical solutions to the above described purpose are described herein:

The present invention discloses embodiments of a method of real-time frequency calibration for a segmented-VCO-based PLL. The segmented VCO comprises: at least one VCO core with each VCO core comprising multiple frequency segments. The calibration method comprises following steps:

receiving a request to lock a PLL to a desired output frequency;

searching in a look-up table for a segment selection signal corresponding to the desired output frequency, and operating a current VCO core according to the segment selection signal to lock the PLL to the desired output frequency;

obtaining a tuning voltage inputting to the current VCO core, evaluating whether the tuning voltage is within a normal operation range. If the tuning voltage exceeds the normal range, the segment selection signal is adjusted to switch the current VCO core from a current frequency segment to another frequency segment within the same VCO core, or switch the VCO core from a current frequency segment to another frequency segment of a different VCO core until the PLL is locked to the desired output frequency with the tuning voltage staying within the normal operation range.

In the present technical solution, the segmented VCO comprises at least one VCO core and each VCO core comprises multiple frequency segments. The number of frequency segments of each VCO core may be the same or different. In one or more embodiments, the segmented VCO is desired to comprise multiple VCO cores. As compared with single-score VCOs, multi-core VCOs are better for ensuring that each frequency segment has a lower frequency tuning bandwidth and tuning sensitivity.

In the present technical solution, the first step of calibration is to obtain a request from an external input. The request includes a desired output frequency after the PLL is locked. Next, given the output frequency, a look-up table is searched for a corresponding frequency segment having a frequency range covering the output frequency, a corresponding VCO core to which the corresponding frequency segment belongs and thus a segment selection signal is thus generated. Based on the segment selection signal, the corresponding VCO core is controlled to lock the PLL to the desired output frequency.

In the present technical solution, the look-up table includes information of frequency ranges of each frequency segment of each VCO core. In one or more embodiments, the lookup table may be established by sweeping each VCO core. In some preferred embodiments, when establishing a look-up table for multiple VCO cores, all VCO cores other than the VCO core currently under sweeping may be disabled. In the present technical solution, the look-up table may be initialized and established during the first calibration. Alternatively, a look-up table already established may be used.

In the present technical solution, in order to achieve a lower tuning sensitivity for each frequency segment, each frequency segment of a VCO core has a narrower frequency range as well as less frequency overlap between two adjacent frequency segments as compared with the technical solution described in Patent CN112953532B. As a result, drifting out of a current frequency segment and thus causing a frequency unlock is more likely to occur under temperature variations or other factors. To solve the problem, the present technical solution adopts a real-time temperature calibration method, which involves continuously monitoring whether a tuning voltage inputting to the VCO is normal to determine whether there is a need to adjust the frequency segment or the VCO core. This ensures that the output frequency falls into an appropriate frequency segment after temperature changes, thus preventing PLL unlock. Specifically, while the PLL maintains a closed-loop lock status, in real-time or at a predetermined time interval (for example, a few microseconds), the tuning voltage VT output from a PLL's low-pass filter to the operating VCO core is obtained or read to determine whether the obtained tuning voltage is within a normal operation range. When the tuning voltage is within the normal operation range, it indicates the output frequency of the VCO core does not drift out of the frequency range of the frequency segment due to temperature variations or other factors. Therefore, there is no need for switching frequency segments. When the acquired tuning voltage is abnormal, e.g., exceeding the normal operation range, it indicates the output frequency of the VCO core will drift outside a frequency range covered by the current frequency segment, thereby likely causing the PLL to lose lock. In this case, it is necessary to adjust the segment selection signal to switch to another frequency segment having a higher or lower frequency range. After switching, the tuning voltage is read in real-time or at predetermined time intervals to determine whether it is within the normal operation range. If it is within the normal operation range, no further switching is required. Otherwise, the segment selection signal is further adjusted to switch frequency segments until the acquired tuning voltage is within the normal operation range after PLL locked.

In the present technical solution, the switching of frequency segments includes two scenarios: a direct frequency segment switching when a target frequency segment is located within the same VCO core as the current frequency segment, or a cross-core switching and a frequency segment switching when a target frequency segment is located in a different VCO core from the current segment.

In the abovementioned calibration method, utilizing real-time or periodic status checks of the tuning voltage inputting to the VCO core, the frequency segment may be adjusted in advance through an adjustment of the segment selection signal before the tuning voltage becomes abnormal. This ensures that the output frequency of the VCO always remains within a frequency segment that has a matched frequency range. Consequently, this allows the PLL to continuously maintain its lock status under various temperature changes, avoiding phase noise deterioration and sudden unlock caused by external temperature variations, thereby affecting the stability of the PLL system.

In the present invention, a preferred adjustment for segment selection signal is specifically implemented such that when the tuning voltage exceeds an upper bound of the normal operation range, the segment selection signal is adjusted to switch from a current frequency segment of the VCO core to an adjacent frequency segment with a higher frequency range; or when the tuning voltage falls below a lower bound of the normal operation range, the segment selection signal is adjusted to switch from the current frequency segment of the VCO core to an adjacent frequency segment with a lower frequency range.

In the present invention, a predetermined normal operation range of the tuning voltage is used to determine whether the tuning voltage is normal. The normal operation range is defined as a range of the tuning voltage within which the VCO core can operate normally and stably, e.g., between 0.5V and 2.8V. The upper bound (e.g., 2.8V) and the lower bound (e.g., 0.5V) of the normal operation range are critical tuning voltage. When the tuning voltage exceeds the upper bound or falls below the lower bound of the normal operation range, phase noise performance of the PLL may severely deteriorate to make the PLL highly susceptible to temperature variations and thus leading to PLL unlock. In such cases, the tuning voltage is considered abnormal.

When the segmented-VCO-based PLL has its frequency locked, the obtained tuning voltages reaches or exceeds the upper bound under increasing temperature, an adjustment signal is characterized as +1 for the segment selection signal, which means adjusting the segment selection signal to an adjacent segment with a higher frequency range. On the other hand, the acquired tuning voltages reaches or falls below the lower bound under decreasing temperature, an adjustment signal is characterized as −1 for the segment selection signal, which means adjusting the segment selection signal to an adjacent segment with a lower frequency range.

The present technical solution utilizes a step-by-step adjustment of frequency segments to achieve rapid frequency segment switching more stably, thus avoiding the deterioration of PLL phase noise performance or even unlock due to continuous temperature variations, which effectively enhances the operational stability and reliability of the segmented-VCO-based PLL.

Moreover, prior to adjusting the segment selection signal, it needs to be determined whether the current segment frequency of the VCO core is located within the same VCO core as the adjacent frequency segment;

If yes, a direct switching to the adjacent frequency segment is performed;

If no, the VCO core containing the adjacent frequency segment is enabled and all other VCO cores are disabled, and a switching is performed to the adjacent frequency segment.

In the present technical solution, for scenarios using multiple VCO cores to further reduce the tuning sensitivity of each frequency segment, it is also necessary to determine whether the segment selection signal involves crossing VCO cores. When there is no cross-core requirement, it indicates the target VCO core and the current VCO core are the same. Accordingly, the segment selection signal can be changed to the adjacent segment according to the adjustment signal.

When the target adjacent frequency segment is located in a different VCO core, specific considerations are taken into account in order to perform VCO core crossing and subsequent segment switching. When the current frequency segment is the lowest frequency segment of the first VCO core and an adjustment to a frequency segment with a lower frequency range is needed, a second VCO core with a lower frequency range is enabled, wherein the segment selection signal is adjusted to a frequency segment of the second VCO core having the highest frequency range, and other VCO cores, including the first VCO core, are disabled simultaneously. Afterwards, by obtaining the tuning voltage in real time, a correct segment selection signal for the second VCO core may be ultimately selected to achieve PLL locking. Similarly, when the current frequency segment is the highest frequency segment of the first VCO core and an adjustment to a frequency segment with a higher frequency range is needed, a third VCO core with a higher frequency range is enabled, wherein the segment selection signal is adjusted to a frequency segment of the third VCO core having the lowest frequency range, and other VCO cores, including the first VCO core, are disabled simultaneously. Afterwards, by obtaining the tuning voltage in real time, a correct segment selection signal for the third VCO core may be ultimately selected to achieve PLL locking.

Furthermore, the aforementioned method to establish the look-up table comprises the following steps:

Performing frequency sweeping to each VCO core of the at least one VCO core and establishing the look-up table based on frequency ranges of multiple frequency segments of each VCO core; and When performing frequency sweeping to any VCO core, enabling the VCO core under sweeping and disabling all other VCO cores, and using the PLL to sweep each frequency segment among the multiple frequency segments. When the PLL transitions from an unlock status to a lock status, or from a lock status to an unlock status, identifying the lower bound and upper bound of a frequency range for each frequency segment.

In the present invention, sweeping methods disclosed in CN112953532B may be used for frequency sweeping for a single VCO core. In some embodiments, an approximate output frequency range of the VCO core to be swept is known prior to sweeping. The sweeping control signal is set to start from a first initial frequency that is below the lower bound of the approximate output frequency range and proceed in a fixed frequency steps, e.g., 10 MHz, to higher frequencies during sweeping. During the sweeping process, the PLL's lock or unlock status is continuously monitored using a lock detection signal generated by a phase frequency detector in the PLL. For example, the lock detection signal has a logical output of 0 to represent an unlock status for the PLL, or a logical output of 1 to represent a lock status for the PLL. Therefore, the lock detection signal changes when the PLL transitions from an unlock status to a lock status, or from a lock to unlock status. Such signal changes are used to identify an actual lower bound and upper bound of each frequency segment during the sweeping process, thereby determining a frequency range of each frequency segment. In one or more embodiments, the sweeping control signal may also be set to start from a second initial frequency that is above the upper bound of the approximate output frequency range, proceeding in a fixed frequency steps to lower frequencies during sweeping.

In the present technical solution, in sweeping multi VCO cores, at a power-on stage for frequency selection, enabling control signals can first be sent to each VCO core to enable a first VCO core and disable others VCO cores in terms of timing. Upon completion of sweeping the first VCO core, the frequency range of each frequency segment in the first VCO core is stored in a memory. Afterwards, updated enabling control signals are sent to each VCO core to enable the second VCO core while disabling other cores. Upon completion of sweeping the second VCO core, the frequency range of each frequency segment in the second VCO core is stored in the memory. Similar process continues until sweeping is completed for all VCO cores and the frequency range of each frequency segment of all VCO cores is stored in the memory to finish establishing the look-up table.

Furthermore, when the look-up table is established, redundant frequency segments of each VCO core are deleted to ensure that in two adjacent VCO cores, the VCO core having a higher frequency range only has a lowest frequency segment overlapped in frequency with a highest frequency segment of the VCO core having a lower frequency range.

After sweeping and establishing the look-up table for each VCO core, an excessive overlap between frequency segments may exist in two adjacent VCO cores in the established look-up table. As a result, multiple segment switching after core crossing may be needed to reach a target frequency segment of adjacent frequency range, which increases the time it takes to adjust from an initial frequency segment in one VCO core to the target frequency segment in another VCO core. To solve this problem, in embodiments of the present invention, the look-up table stored in memory is adjusted such that, after ensuring existence of frequency overlap between two adjacent VCO cores, only the frequency segment of the lowest frequency range of the higher frequency range VCO core overlaps with the frequency segment of the highest frequency range of the lower frequency range VCO core in the final look-up table, with all other overlapped frequency segments deleted. Consequently, this approach shortens the lock time required for real-time calibration under temperature variations, reduces data volume of the lookup table and segment selection signal, thereby saving storage space and enhancing the retrieval speed of the output frequency.

Another objective of the present invention is to provide a real-time frequency calibration system for segmented VCOs. This system utilizes a tuning voltage detection module to monitor the tuning voltage input to the VCO core in real-time. In the event of abnormal tuning voltage, the segment selection signal is adjusted to facilitate segment switching or core crossing. This not only prevents unlock due to frequency drifting out of a segment but also allows each frequency segment within the VCO core of this system to have a narrower frequency range and a smaller segment frequency overlap rate (e.g., relative bandwidth of the frequency overlap <3%) compared to existing technologies. This ensures that each segment has a lower tuning sensitivity, which is advantageous for the signal source to exhibit sufficiently low in-band phase noise after frequency lock.

The abovementioned objective is achieved through the following described implementation:

A real-time frequency calibration system of a segmented VCO comprises:

at least one VCO core, each VCO core comprising multiple frequency segments;

a memory, used for storing a look-up table;

a tuning voltage detection unit, used to detect the tuning voltage input to the VCO core from a PLL, determine whether the tuning voltage is within a normal operation range, and output an adjustment signal if the tuning voltage exceeds the normal operation range;

a microcontroller unit, used for receiving a request to lock an output frequency from the PLL, searching for a segment selection signal from the look-up table based on the output frequency, controlling operation of a corresponding VCO core based on the segment selection signal, thereby locking the PLL to the output frequency. Additionally, upon receiving an output frequency adjustment signal, adjusting the segment selection signal in response to the adjustment signal to switch from a frequency segment of the current VCO core to another frequency segment within the same core, or to a frequency segment of a different VCO core.

In the present technical solution, the system comprises at least one VCO core, each VCO core comprising multiple frequency segments. Under the same conditions of output frequency spanning range, the setup of multi-core VCOs, as composed to a single-core VCO, allows each frequency segment of each core to have a narrower frequency range and smaller frequency overlap rate, thereby resulting in lower tuning sensitivity. In one or more embodiments, the frequency overlap rate between two adjacent frequency segments of adjacent frequency ranges is less than 3%. Furthermore, sufficient frequency overlap rate, e.g., >1%, is needed between VCO cores of adjacent frequency ranges to avoid frequency gaps between VCO cores of adjacent frequency ranges due to process variations or other factors. In the present technical solution, the configuration of multi VCO cores with independent enabling controls for each VCO core ensures that only one VCO core is enabled for operation at any given time, thus preventing cross-core interference.

The look-up table in the memory includes information of frequency ranges of each frequency segments of each VCO core. The memory can be ROM, RAM, or FLASH, etc. When operating or enabling a specified VCO core, the microcontroller unit reads data from the memory and applies the data accordingly.

The tuning voltage detection unit may be implemented using tuning voltage detection circuits, which are typically comparator circuits. The tuning voltage detection unit detects the tuning voltage in real-time or at predetermined time intervals to determine whether the tuning voltage input from the PLL to the current VCO core is within the normal operation range. If the tuning voltage is outside the normal operation range, it sends an adjustment signal for segment selection to the microcontroller unit; otherwise, it does not send an adjustment signal.

In the present technical solution, after receiving a request for an output frequency, the microcontroller unit searches for a segment selection signal from the look-up table and operates a VCO core corresponding to the segment selection signal, thereby locking the PLL to the output frequency. When the PLL is in a lock status, the microcontroller unit, upon receiving an adjustment signal from the tuning voltage detection unit, adjusts the segment selection signal based on the adjustment signal. The adjustment enables switching from the current frequency segment of the VCO core to another frequency segment within the same core, or to a frequency segment or of a different VCO core.

Furthermore, when the tuning voltage exceeds an upper bound of the normal operation range, the microcontroller unit adjusts the segment selection signal based on the generated adjustment signal to switch from the current frequency segment of the VCO core to an adjacent frequency segment having a higher frequency range. When the specified tuning voltage falls below a lower bound of the normal operation range, the microcontroller unit adjusts the segment selection signal based on the generated adjustment signal to switch the current frequency segment of the VCO core to an adjacent frequency segment having a lower frequency range.

Furthermore, at least two VCO cores are included and two adjacent VCO cores, among the at least two VCO cores, have at least some frequency segments with frequency overlaps.

Furthermore, between the two adjacent VCO cores, the VCO core having a higher frequency range only has its lowest frequency segment overlapped in frequency with the highest frequency segment of VCO having a lower frequency range.

Furthermore, among all the frequency segments, at least some of the adjacent frequency segments have the frequency overlap rate less than 3%.

Compared to existing technologies, the present invention has the following advantages and beneficial effects:

1. In the present invention, through real-time or periodic status checks for a tuning voltage input to the VCO core from the PLL, a frequency segment may be adjusted in advance by adjusting a segment selection signal when the tuning voltage is abnormal. This ensures that the output frequency of the VCO core always remains within a frequency segment having a matched frequency range. Consequently, the PLL can continuously maintain its lock status under temperature variations, preventing phase noise deterioration and sudden unlock caused by external temperature variations, thereby enhancing operation stability and reliability for the segmented-VCO-based PLL.

2. In the present invention, frequency segments may be adjusted in real-time by detecting in real-time or at predetermined intervals whether the tuning voltage is normal, and thus allowing each frequency segment within a VCO core of the PLL system to have a narrower frequency coverage range and a smaller frequency overlap rate compared to existing technologies. For example, at least some of the adjacent frequency segments may have a frequency overlap rate less than 3%, thereby ensuring that each frequency segment has a lower tuning sensitivity, which is advantageous for the signal source to exhibit sufficiently low in-band phase noise after frequency lock.

3. In the present invention, more stable and faster switching of frequency segments may be achieved by initializing the frequency sweeping to create a frequency segment look-up table. This effectively enhances operational stability and reliability for segmented-VCO-based PLLs.

4. The use of multiple VCO cores allows a narrower frequency range and a smaller frequency overlap rate for each frequency segment of each VCO core, thereby further reducing the tuning sensitivity of each frequency segment.

5. In the present invention, after the look-up table is established, redundant overlapped frequency segments are removed to not only shorten the lock time required for real-time calibration under temperature variations, but also reduce data volume needed for the lookup table and segment selection signal, thereby saving storage space and enhancing the retrieval speed of the output frequency.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

FIG. 1 depicts a block diagram of a calibration method in embodiments of the present invention;

DETAILED DESCRIPTION OF THE PREFERRED EMBODIMENTS

Figure 2:
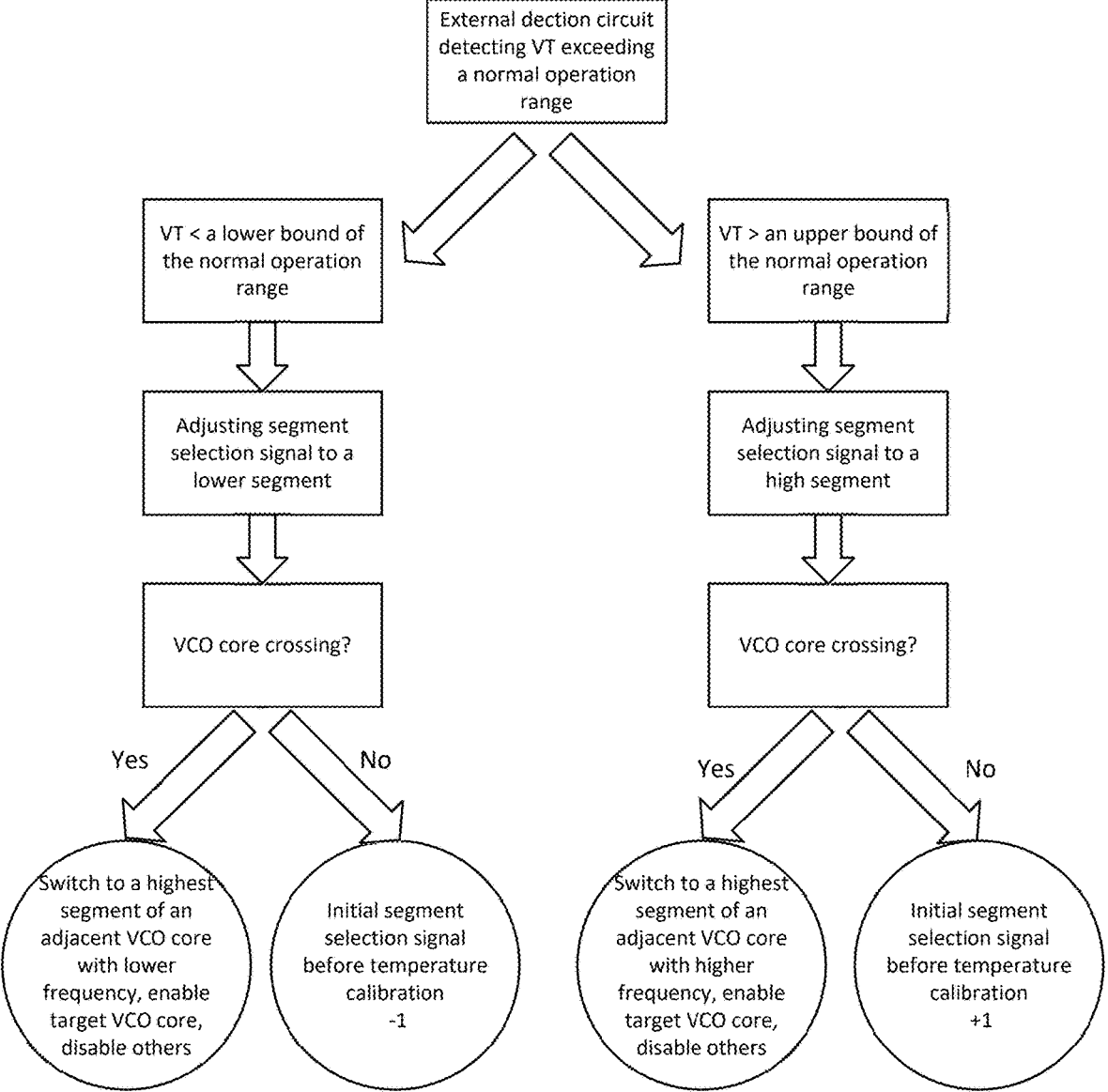
FIG. 2 depicts a block diagram of adjustment process when the tuning voltage exceeds a normal operation range in embodiments of the present invention.

In the following description, specific embodiments and figures are set forth in order to provide an understanding of purposes, technical solutions and benefits of the present invention. The exemplary embodiments of the present invention and descriptions hereinafter are explanations for the present invention only, rather than limitations for the present invention.

When the specification uses terms such as "front", "back", "left", "right", "above", "below", "vertical", "horizontal", "high", "low", "inside", "outside", and other terms of orientation or positional relationship, it is intended to make references to orientation or positional relationship described in the drawings. This is only for the convenience of simplifying the description when describing the invention. It does not indicate or imply that the devices or elements referred to must have a specific orientation, be constructed and operated in a specific orientation. Thus, it is not intended by so doing to limit the scope of the present invention to the particular features of the embodiments depicted and described.

In the description of the present invention, it should be understood that the term "real-time" includes both continuous and uninterrupted execution, and execution at predetermined time intervals.

Embodiment 1

FIG. 1 depicts a frequency calibration method for a segmented-VCO-based PLL, which comprises at least one VCO core with each VCO core comprising multiple frequency segments. The calibration comprises following steps:

receiving a request to lock a PLL to a desired output frequency;

searching in a look-up table for a segment selection signal corresponding to the desired output frequency, and operating a current VCO core according to the segment selection signal to lock the PLL to the desired output frequency;

obtaining a tuning voltage inputting to the current VCO core in real-time or at predetermined time intervals, evaluating whether the tuning voltage is within a normal operation range. If the tuning voltage exceeds the normal operation range, the segment selection signal is adjusted to switch the current VCO core from a current frequency segment to another frequency segment within the same VCO core, or switch from the current VCO core to another frequency segment of a different VCO core until the PLL is locked to the desired output frequency with the tuning voltage staying within the normal operation range.

In one or more embodiments, the look-up table only needs to be established once. After establishing the look-up table from frequency sweeping, the look-up table is stored in a non-volatile memory, e.g. ROM. Data may be retrieved directly from the look-up table for each calibration. In some embodiments, a look-up table can be established multiple times. Each time after power of PLL is on, a look-up table is re-established in a RAM through frequency sweeping.

In some preferred embodiments, based on whether a tuning voltage is within a normal operation range (for example, 0.5V-2.8V), the tuning voltage may be determined as normal or not. When the tuning voltage exceeds an upper bound of the normal operation range, (e.g., 2.8V), the segment selection signal is adjusted to switch from the current frequency segment of the VCO core to an adjacent frequency segment having a higher frequency range; when the tuning voltage falls below a lower bound of the normal operation range (e.g., 0.5V), the segment selection signal is adjusted to switch from the current frequency segment of the VCO core to an adjacent frequency segment having a lower frequency range. As temperature increases and the obtained tuning voltages reaches or exceeds the upper bound, an adjustment signal is characterized as +1 for the segment selection signal, meaning adjusting the segment selection signal to an adjacent segment having a higher frequency range. On the other hand, as temperature decreases and the acquired tuning voltages reaches or falls below the lower bound, the adjustment signal is characterized as −1 for the segment selection signal, meaning adjusting the segment selection signal to an adjacent segment having a lower frequency range.

In some embodiments, the adjacent frequency segment having a higher or lower frequency range than the current frequency segments may be located in the same VCO core as the current frequency segment or in a different VCO core. In one or more embodiments, when two adjacent VCO cores have multiple frequency segments with overlapping frequencies, the frequency ranges of the segments before and after the initial segment switching may not be adjacent. In this case, segment switching continues after the initial segment switching until a frequency segment is reached whose frequency range is adjacent to the frequency range of the segment before the initial segment switching.

In the present embodiment 1, by real-time status checking the tuning voltage input to the VCO core, the frequency segment may be adjusted in advance through an adjustment of the segment selection signal when the tuning voltage becomes abnormal. This ensures that the output frequency of the VCO core always remains within a frequency segment having a matched frequency range. Consequently, the PLL can continuously maintain its lock status under temperature variations, thus preventing phase noise deterioration and sudden unlock caused by external temperature variations or other factors, which affects stability of the PLL system.

Embodiment 2

On the basis of Embodiment 1, prior to adjusting the segment selection signal, determine whether the current segment frequency of the VCO core is located within the same VCO core as the adjacent frequency segment;

If yes, directly switching to the adjacent frequency segment is performed;

If no, the VCO core containing the adjacent frequency segment is enabled while all the other VCO cores are disabled, and a switching operation is made to the adjacent frequency segment.

As depicted in FIG. 2, when the tuning voltage (VT) is detected to exceed the normal operation range, if the tuning voltage is below the lower bound of the normal operation range, then the segment selection signal needs to be lowered to an adjacent frequency segment having a lower frequency range accordingly. Prior to adjustment, it is necessary to determine whether the segment selection signal involves VCO core-crossing. If no core-crossing involved, the target frequency segment is located in the same VCO core as the current frequency segment, and the segment selection signal may be directly adjusted by −1 for switching to the adjacent segment with a lower frequency range. If core-crossing involved, the target frequency segment is located in a different VCO from the initial frequency segment. In this case, the target VCO core with a lower frequency range is enabled first while the other VCO cores are disabled; the segment selection signal is adjusted to the highest frequency segment of the target VCO core. Subsequently, the segment selection signal is adjusted, by real-time detection of the tuning voltage, to an appropriate frequency segment within the target VCO core to achieve PLL lock.

Similarly, as depicted in FIG. 2, when the tuning voltage is detected to exceed the normal operation range, if the tuning voltage exceeds an upper bound of the normal operation range, the segment selection signal needs to be raised to select an adjacent frequency segment with a higher frequency range accordingly. Prior to adjustment, it is necessary to determine whether the segment selection signal adjustment involves VCO core crossing. With no core crossing, the segment selection signal is directly adjusted by +1 for switching to the adjacent segment having a higher frequency range. With core crossing involved, the target VCO core having a higher frequency range needs to be enabled while other VCO cores are disabled. The segment selection signal is then adjusted to the lowest frequency segment of the target VCO core. Subsequently, the segment selection signal is adjusted, by real-time detection of the tuning voltage, to an appropriate frequency segment within the target VCO core.

Embodiment 3

Figure 3:
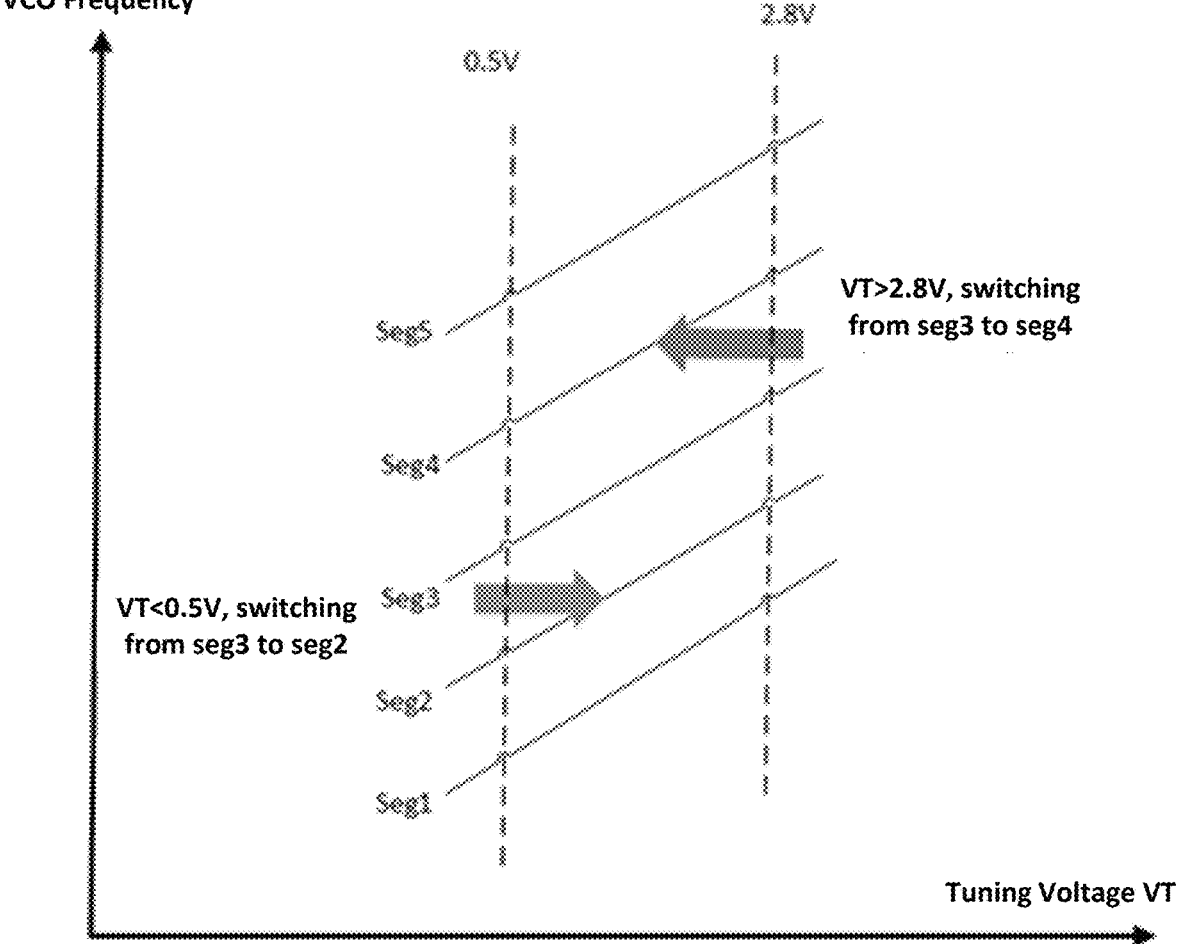
FIG. 3 depicts a calibration schematic diagram of segment switching within the same VCO core in embodiments of the present invention.

FIG. 3 depicts a calibration schematic diagram of segment switching within the same VCO core. In an example of a normal operation range of the tuning voltage between 0.5 V and 2.8V, when the tuning voltage is within the normal operation range, a frequencies overlap (with a frequency overlap rate <3%) between adjacent frequency segments may ensure a stable lock status and optimal performance. When the tuning voltage is less than 0.5 V or greater than 2.8 V, under external environmental influence such as temperature variations, the PLL is highly susceptible to phase noise deterioration or even a sudden unlock.

As depicted in FIG. 3, the tuning voltage is checked in real-time when the PLL is maintained in a closed-loop status. When the tuning voltage is less than 0.5V, the segment selection signal is adjusted by −1 for segment switching from the current frequency segment Seg 3 to an adjacent frequency segment Seg 2 that has a lower frequency range. When the tuning voltage is greater than 2.8V, the segment selection signal is adjusted by +1 for segment switching from the current frequency segment Seg 3 to an adjacent frequency segment Seg 4 that has a higher frequency range. Because the frequency segment is preemptively adjusted based on the condition of the tuning voltage, the output frequency of the VCO core remains stable. There is frequency overlap in frequency ranges of adjacent frequency segments when the tuning voltage is within the normal operation range. After segment switching upward or downward, the tuning voltage still falls within the normal operation range (0.5V-2.8V).

Embodiment 4

Figure 4:
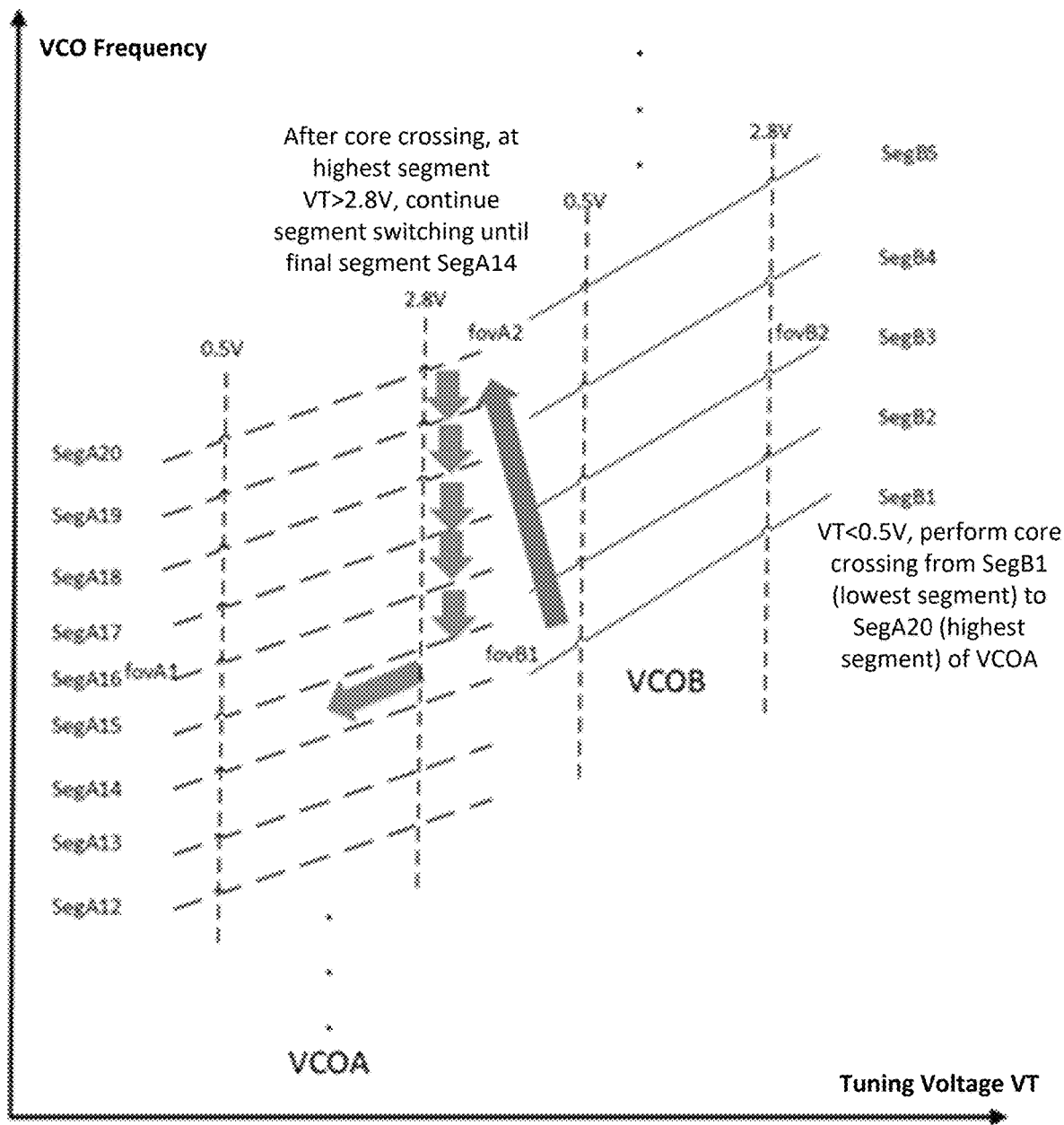
FIG. 4 depicts a calibration schematic diagram involving core-crossing between two adjacent VCO cores (VCOA, VCOB) in embodiments of the present invention.

FIG. 4 depicts a calibration schematic diagram of core-crossing between two adjacent VCO cores (VCOA, VCOB). As shown, SegA16 to SegA20, which are the segments with five highest frequency ranges in VCOA overlap with SegB1 to SegB4, which are the segments of four lowest frequency ranges in VCOB. Similarly, the normal working range of the tuning voltage is 0.5V~2.8V. As shown in FIG. 4, the initial segment is SegB1 of VCOB (the lowest frequency segment of VCOB). When the tuning voltage VT falls below 0.5V, due to involvement of VCO core crossing, a downward switching is performed from SegB1 to segA20 of VCOA (the highest frequency segment of VCOA). After completing the cross-core switching, since a target frequency segment has not yet been reached, it is necessary to continue downward segment switching until the detected tuning voltage finally falls within the normal working range. As shown in FIG. 4, the final frequency segment adjustment is to SegA14.

Embodiment 5

On the basis of abovementioned embodiments, a method of establishing the look-up table comprises the following steps:

Performing frequency sweeping to each VCO core of the at least one VCO core and establishing the look-up table based on frequency ranges of multiple frequency segments of each VCO core; and When performing frequency sweeping to any VCO core, enabling the VCO core under sweeping and disabling all other VCO cores, and using the PLL to sweep each frequency segment among the multiple frequency segments. When the PLL transitions from an unlock status to a lock status, or from a lock status to an unlock status, identifying the lower bound and upper bound of a frequency range for each frequency segment.

In some embodiments, frequency sweeping may be linear stepping or variable stepping that balances scanning accuracy and efficiency.

In some preferred embodiments, sweeping may start from the VCO core with the lowest frequency range and proceed sequentially to VCO cores of higher frequency ranges; or it can start from the VCO core with the highest frequency range and proceed sequentially to VCO cores of lower frequency ranges.

In some embodiments, sweeping methods disclosed in CN112953532B may be used for frequency sweeping for a single VCO core. For instance, after determining the Fmin and Fmax of designed output frequency range of the first VCO core that comprises N frequency segments, sweeping of the first frequency segment may start from Fmin×(1–D1) with a sweeping step of df1, in which D1 is coefficient, such as 10%, to ensure that the PLL does not lock at Fmin×(1–D1). Subsequently, the frequency at which the PLL transitions from an unlock status to a lock status corresponds to the actual lower bound frequency F1L of the first frequency segment. Afterward, the sweeping continues until the PLL transitions from a lock status to an unlock status, with the frequency of the last lockable sweeping step before the unlock status being the actual upper-bound frequency F1H of the first frequency segment. Next, sweeping of the second frequency segment can start from F1H*(1–D2), with a sweeping step of df2, in which D2 is coefficient, such as 12%, to ensure that the PLL does not lock at F1H×(1–D2). Sweeping step df2 may be the same as or different from sweeping step df1. Subsequently, the frequency at which the PLL transitions from an unlock status to a lock status corresponds to the actual lower-bound frequency F2L of the second frequency segment. Afterward, the sweeping continues until the PLL transitions from a lock status to an unlock status, with the frequency of the last lockable sweeping step before the unlock status being the actual upper-bound frequency F2H of the second frequency segment. In the same fashion, the sweeping is completed for the third frequency segment, the fourth frequency segment, . . . , up to the Nth frequency segment. The actual frequency range of each frequency segment is stored in a memory to establish a look-up table. In one or more embodiments, the frequency overlap rate between two adjacent frequency segments, for example, the first frequency segment and the second frequency segment, may be defined as 2(F1H–F2L)/(F1H+F2L).

In some embodiments, for scenarios involving at least two VCO cores, the operation of two VCOs is used as an example. The overall frequency range of the first VCO core VCOA is lower than that of the second VCO core VCOB. Additionally, the first and second VCO cores have NA and NB frequency segments, respectively, with frequency overlap existing between adjacent frequency segments. The designed output frequency range for VCOA is between FminA and FmaxA. The designed output frequency range for VCOB is between FminB and FmaxB. There is also frequency overlap between VCOA and VCOB, meaning that FmaxA>FminB.

Prior to sweeping VCOA, VCOA is enabled and VCOB is disabled. Using the aforementioned sweeping method for a single-core VCO, the sweeping of NA frequency segments in VCOA is completed to establish a look-up table for the NA frequency segments in VCOA. Subsequently, VCOB is enabled and VCOA is disabled. Similarly, the sweeping method for a single-core VCOB is used to complete sweeping of NB frequency segments in VCOB to establish a look-up table for the NB frequency segments in VCOB. Although the present embodiment only takes the two VCO cores as an example, it should be understood that those skilled in the art can complete the sweep of all VCO cores based on the actual number of cores and establish the look-up table accordingly.

Embodiment 6

Based upon the aforementioned embodiments, after establishing the look-up table, redundant frequency segment(s) in each VCO core are deleted such that, in two adjacent VCO cores, only the frequency segment with the lowest frequency range in the VCO core having a higher frequency range overlaps with the frequency segment with the highest frequency range in the VCO core having the lower frequency range.

Figure 5:
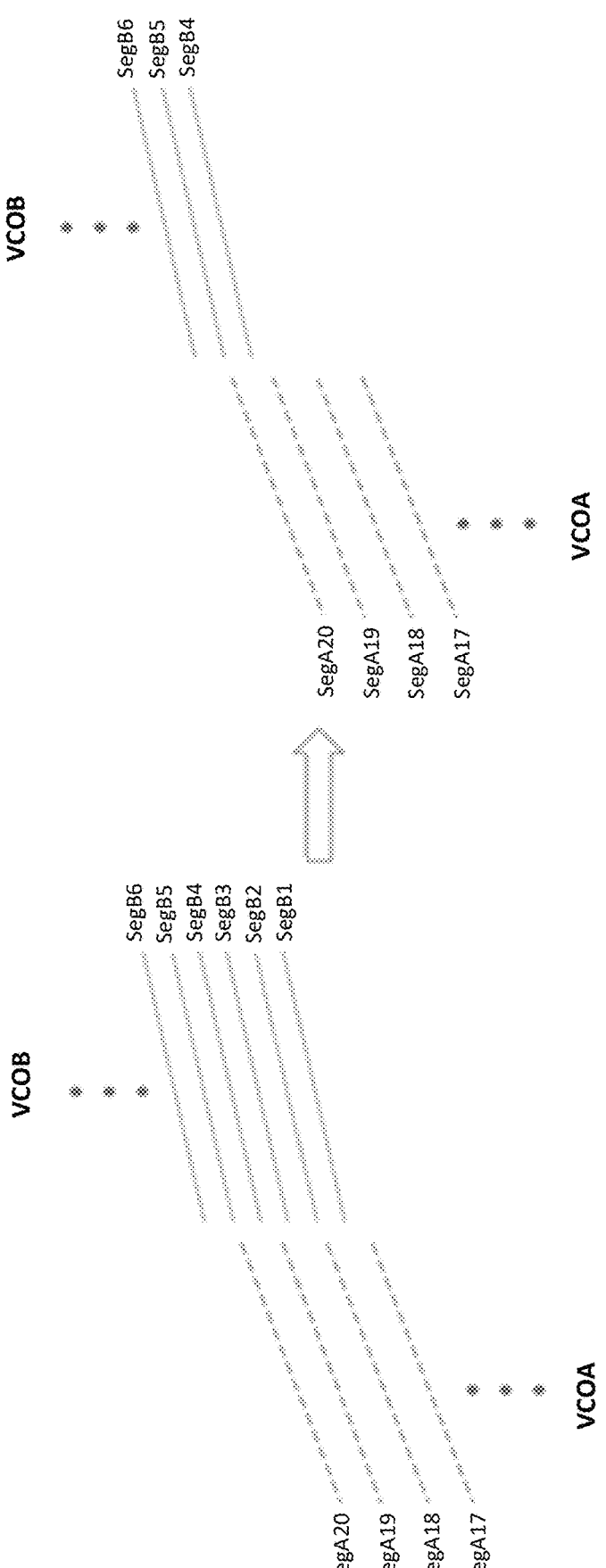
FIG. 5 depicts a schematic diagram of deleting redundant segments when two adjacent VCO cores (VCOA, VCOB) in the look-up table have multiple overlapped frequency segment in embodiments of the present invention.

Take two VCO cores with adjacent frequency ranges VCOA and VCOB as an example. After sweeping two VCO cores, it is found that the three highest frequency segments of VCOA, SegA18 to SegA20, overlap in frequency with the four lowest frequency segments, SegB1 to SegB4, of VCOB, as shown on the left side of FIG. 5.

In response, the redundant segments from one of the VCO cores or some of the redundant segments from both VCO cores may be deleted. Afterwards, segment information of each VCO core after deletion of redundant segments is saved to form a new look-up table. As shown on the right side of FIG. 5, in this embodiment, the three redundant segments SegB1, SegB2, and SegB3 of VCOB were deleted. It is still ensured that there is frequency overlap in the frequency coverage range between the adjacent VCOA and VCOB, namely, only SegA20 and SegB4 overlap in frequency.

Streamlining segment selection information by removing redundant segments may reduce storage space and increase frequency retrieval speed during a rapid locking stage. Furthermore, segment switching time may also be reduced for real-time temperature calibration across VCO cores.

Embodiment 7

Figure 6:
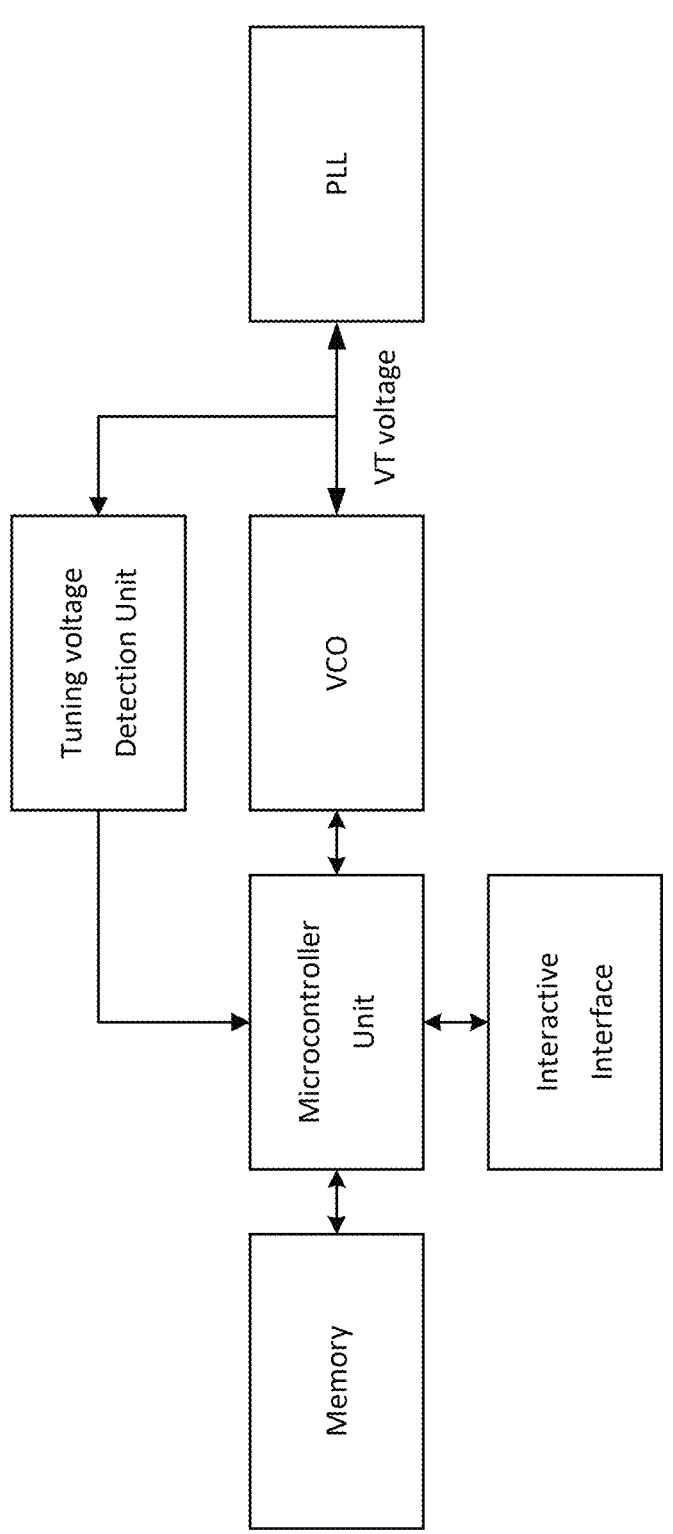
FIG. 6 depicts a block diagram of calibration system in embodiment of the invention.

As depicted in FIG. 6, a method of frequency real-time calibration for segmented-VCO-based PLL comprises:

at least one VCO core, each VCO core comprising multiple frequency segments;

a memory, used for storing a look-up table;

a tuning voltage detection unit, used to obtain the tuning voltage input to the VCO core from the PLL in real-time or at predetermined time interval, to determine whether the tuning voltage is normal, and to send an adjustment signal if the tuning voltage is abnormal;

a microcontroller unit, used for receiving a request to lock the PLL to an output frequency. The microcontroller unit searches for a segment selection signal from the look-up table based on the output frequency, controls operation of a corresponding VCO core based on the segment selection signal to lock the PLL to the output frequency. Additionally, upon receiving an output frequency adjustment signal, the microcontroller unit adjusts the segment selection signal based on the adjustment signal for segment switching from the current frequency segment of the VCO core to another frequency segment within the same core, or to a frequency segment of a different VCO core.

In one or more embodiments, the tuning voltage detection unit uses a voltage comparator.

In some embodiments, based on whether the tuning voltage is within a normal operation range, the tuning voltage is determined as normal or not. When the tuning voltage exceeds an upper bound of the normal operation range, the segment selection signal is adjusted for segment switching from the current frequency segment of the VCO core to an adjacent frequency segment with a higher frequency range; or when the tuning voltage falls below a lower bound of the normal operation range, the segment selection signal is adjusted for segment switching from the current frequency segment of the VCO core to an adjacent frequency segment with a lower frequency range.

In some embodiments, the system comprises at least two VCO cores, among which two adjacent VCO cores comprise at least some frequency segments having frequency overlaps. In one or more embodiments, the frequency overlap rate of adjacent VCO cores is greater than or equal to 1%.

In some embodiments, in two adjacent VCO cores, the VCO core having a higher frequency range only have its lowest frequency segment overlapping in frequency with the highest frequency segment of the VCO core having a lower frequency range.

In some embodiments, the frequency overlap rate between adjacent frequency segments among the multiple frequency segments may be less than 3%.

In some embodiments, as depicted in FIG. 6, the system also includes an interactive interface, which is connected to the microcontroller unit to allow user access for data stored in the memory, or for programming the microcontroller unit for control updates, debugging, etc.

In some embodiments, the microcontroller unit can be realized or replaced with a state machine unit.

In some embodiments, PLLs disclosed in CN112953532B may be used. A low-pass filter, that is a loop filter, outputs a tuning voltage to a VCO core after receiving a correction signal from the phase frequency detector. The VCO core then outputs an output frequency based on the tuning voltage, while the tuning voltage detection unit detects whether the tuning voltage, which is delivered from the low-pass filter to the VCO core, is within the normal operation range.

In the present invention, the use of terms like "first", "second", etc., (for example, the first VCO core, the second VCO core, etc.) is solely for the purpose of clarity in description and to distinguish specific components, with no intention to limit any order or to imply any precedence in importance. Moreover, the term "connected", as used in this invention, can mean directly connected or indirectly connected through other components unless specified otherwise.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

The invention claimed is:

1. A method of real-time frequency calibration for a phase-lock loop (PLL) that is based on a segmented voltage controlled oscillator (VCO), the segmented VCO comprising at least one VCO core, the method comprising:

receiving a request to lock the PLL to an output frequency;

searching in a look-up table for a segment selection signal corresponding to the output frequency, and operating a current VCO core based on the segment selection signal to lock the PLL to the output frequency, the look-up table is established using steps comprising performing frequency sweeping to each VCO core of at least one VCO core and establishing the look-up table based on frequency ranges of multiple frequency segments of each VCO core, wherein when performing frequency sweeping to any VCO core, enabling the VCO core under sweeping and disabling all other VCO cores, and using the PLL to sweep each frequency segment among the multiple frequency segments, when the PLL transitions from an unlock status to a lock status, or from a lock status to an unlock status, identifying a lower bound and an upper bound of a frequency range for each frequency segment;

obtaining a tuning voltage inputting to the current VCO core and determining whether the tuning voltage is in a normal operation range, responsive to the tuning voltage exceeding the normal operation range, adjusting the segment selection signal for segment switching from a current frequency segment in the current VCO core to another frequency segment in the current VCO core, or from the current frequency segment in the current VCO core to another frequency segment in another VCO core, until the tuning voltage is within the normal operation range with the PLL being locked to the output frequency.

2. The method of claim 1, wherein:

responsive to the tuning voltage being above an upper bound of the normal operation range, adjusting the segment selection signal for segment switching from the current frequency segment of the current VCO core to an adjacent frequency segment with a higher frequency range; or responsive to the tuning voltage being below a lower bound of the normal operation range, adjusting the segment selection signal for segment switching from the current frequency segment of the current VCO core to an adjacent frequency segment with a lower frequency range.

3. The method of claim 2, wherein:

prior to adjusting the segment selection signal, determining whether the current segment frequency of the VCO core is located within the same VCO core as the adjacent frequency segment;

responsive to yes, performing a direct switching to the adjacent frequency segment;

responsive to no, enabling the VCO containing the adjacent frequency segment and disabling all other VCO cores, performing a segment switching to the adjacent frequency segment.

4. The method of claim 1, wherein:

once the look-up table is established, redundant frequency segments of each VCO core are deleted to ensure that in two adjacent VCO cores, the VCO core having a higher frequency range only has a lowest frequency segment overlapped in frequency with a highest frequency segment of the VCO core having a lower frequency range.

5. The method of claim 1, wherein the normal operation range is the same among different segments in one VCO core.

6. The method of claim 1, wherein the normal operation range is the same among different VCO cores.

7. The method of claim 1, wherein the normal operation range is a voltage range within which the at least one VCO core in the segmented VCO operates stably.

8. The method of claim 1, wherein the segmented VCO comprises multiple VCO cores, when the current VCO core is operating, all other VCO cores is disabled.

9. The method of claim 1, wherein segment switching from the current frequency segment in the current VCO core to another frequency segment in another VCO core is performed when:

the current frequency segment is the lowest frequency segment of the current VCO core and an adjustment to a frequency segment with a lower frequency range is needed; or when the current frequency segment is the highest frequency segment of the current VCO core and an adjustment to a frequency segment with a higher frequency range is needed.

10. A system of real-time frequency calibration for a phase-lock loop (PLL) that is based on a segmented voltage controlled oscillator (VCO), the system comprising:

at least one VCO core, each VCO core comprising multiple frequency segments;

a memory for storing a look-up table, the look-up table is established based on frequency ranges of multiple frequency segments of each VCO core obtained when performing frequency sweeping to each VCO core of at least one VCO core;

a tuning voltage detection unit that detects the tuning voltage input to the VCO core from a PLL, determines whether the tuning voltage is within a normal operation range, and outputs an adjustment signal if the tuning voltage exceeds the normal operation range;

a microcontroller unit for receiving a request to lock an output frequency from the PLL, searching for a segment selection signal from the look-up table based on the output frequency, controlling operation of a corresponding VCO core based on the segment selection signal, thereby locking the PLL to the output frequency, upon receiving an output frequency adjustment signal, the microcontroller unit adjusts the segment selection signal in response to the adjustment signal to switch from a frequency segment of the current VCO core to another frequency segment within the same core, or to a frequency segment of a different VCO core.

11. The system of claim 10, wherein:

responsive to the tuning voltage being above an upper bound of the normal operation range, the microcontroller unit adjusts the segment selection signal for segment switching from the current frequency segment of the current VCO core to an adjacent frequency segment with a higher frequency range; or responsive to the tuning voltage being below a lower bound of the normal operation range, the microcontroller unit adjusts the segment selection signal for segment switching from the current frequency segment of the current VCO core to an adjacent frequency segment with a lower frequency range.

12. The system of claim 10, wherein:

the segmented VCO comprises at least two VCO cores, two adjacent VCO cores among the at least two VCO cores have at least some frequency segments with frequency overlap.

13. The system of claim 12, wherein:

between the two adjacent VCO cores, the VCO core having a higher frequency range only has its lowest frequency segment overlapped in frequency with the highest frequency segment of VCO having a lower frequency range.

14. The system of claim 10, wherein among all the frequency segments, at least some of the adjacent frequency segments have a frequency overlap rate less than 3%.

15. The system of claim 10, wherein the normal operation range is the same among different segments in one VCO core.

16. The system of claim 10, wherein the normal operation range is the same among different VCO cores.

17. The system of claim 10, wherein the normal operation range is a voltage range within which the at least one VCO core in the segmented VCO operates stably.

18. The system of claim 10, wherein the segmented VCO comprises multiple VCO cores, when one segment in one of the multiple VCO cores is enabled, all other VCO cores is disabled.

*    *    *    *    *